(12) United States Patent
Oguri

(10) Patent No.: US 7,443,203 B2
(45) Date of Patent: Oct. 28, 2008

(54) IMPEDANCE ADJUSTMENT CIRCUIT AND INTEGRATED CIRCUIT DEVICE

(75) Inventor: Takashi Oguri, Tokyo (JP)

(73) Assignee: Nec Corporation, Tokyo (JP)

( * ) Notice: Subject to any disclaimer, the term of this patent is extended or adjusted under 35 U.S.C. 154(b) by 64 days.

(21) Appl. No.: 11/386,813

(22) Filed: Mar. 23, 2006

(65) Prior Publication Data

US 2006/0214682 A1 Sep. 28, 2006

(30) Foreign Application Priority Data

Mar. 23, 2005 (JP) ............................. 2005-083557

(51) Int. Cl.
*H03K 17/16* (2006.01)
(52) U.S. Cl. ......................................... 326/83; 326/30
(58) Field of Classification Search .................... 326/30; 327/108
See application file for complete search history.

(56) References Cited

U.S. PATENT DOCUMENTS

| | | | | |
|---|---|---|---|---|
| 5,606,275 A | * | 2/1997 | Farhang et al. ............... | 327/108 |
| 5,732,027 A | * | 3/1998 | Arcoleo et al. .......... | 365/189.05 |
| 6,384,621 B1 | * | 5/2002 | Gibbs et al. .................... | 326/30 |
| 6,563,347 B2 | * | 5/2003 | Doyle et al. ................... | 327/65 |
| 6,836,143 B2 | * | 12/2004 | Song ............................ | 326/30 |
| 7,038,486 B2 | * | 5/2006 | Aoyama et al. ................ | 326/30 |
| 2002/0060585 A1 | * | 5/2002 | Doyle et al. .................... | 327/65 |
| 2003/0091124 A1 | * | 5/2003 | Gupta et al. .................. | 375/316 |

FOREIGN PATENT DOCUMENTS

JP 2005-26890 1/2005

* cited by examiner

*Primary Examiner*—James H. Cho
*Assistant Examiner*—Thienvu V Tran
(74) *Attorney, Agent, or Firm*—Young & Thompson

(57) ABSTRACT

An NMOS impedance adjustment circuit has a comparator circuit for comparing with a reference electric potential VREFn a divided voltage potential Vin produced by an NMOS array and an external reference resistance. The NMOS array simulates the impedance of an output buffer circuit on the basis of the comparison result. The comparator circuit has three differential circuits. Three 2-input NAND gates and a single three-input NAND gate take the majority of output values of the differential circuits and output the result from the comparator circuit. A reduction of impedance adjustment precision caused by variability within the chip can thereby be inhibited.

2 Claims, 7 Drawing Sheets

IMPEDANCE ADJUSTMENT CIRCUIT AND INTEGRATED CIRCUIT DEVICE

BACKGROUND OF THE INVENTION

1. Field of the Invention

The present invention relates to an impedance adjustment circuit for adjusting the impedance of an input and/or output buffer circuit, and to an integrated circuit device provided with the impedance adjustment circuit.

2. Description of the Related Art

In an interface that operates at high speed, the transmission lines between a transmitting circuit, receiving circuit, and LSI (Large Scale Integrated circuit) are handled as distributed constant circuits, and impedance matching is essential. If the impedance of the transmission lines and the impedance of the load circuit do not match, reflected wave is created at the boundary between the transmission lines and the load circuit, and the reflected wave causes the input buffer circuit to malfunction. A resistance is conventionally added to the output buffer circuit in order to match the impedance. This resistance is integrated into the LSI or is mounted outside of the LSI.

In the resistance that is added to such an output buffer circuit, it is necessary to increase the ratio of the resistance value of a resistance element that is resilient against the effects of process variability and temperature variability in the entire resistance value. In the case that the resistance is composed of a MOS (Metal Oxide Semiconductor) transistor, for example, the size of the MOS transistor must be increased. However, this makes it more difficult to accommodate the transistor in the LSI area and causes the through-current, noise, and power consumption to increase.

Techniques that provide an impedance adjustment circuit inside the LSI have been developed in order to solve such problems and to improve the impedance adjustment precision (see Japanese Laid-Open Patent Application No. 2005-026890). A principal example of the adjustment method is to adjust the impedance in conjunction with the use of a high precision external resistance element. By providing an impedance adjustment circuit, the size of the MOS transistor does not need to be increased, the accommodation factor is improved, the noise and power consumption can be reduced, and an interface that operates at higher speed can be assured.

However, the prior art has the following drawbacks. In recent years, there has been a demand for an impedance adjustment circuit with higher precision due to the fact that interfaces are operating at higher speeds. It is for this reason that there is a need to improve the detection accuracy of the electric potential level when impedance has been converted to electric potential. When the power supply voltage is 1 V, for example, electric potential differences of several millivolts must be detected. With current technology, however, device variability within the chip is becoming more noticeable due to smaller integrated circuits, and there is a new need to consider the variability when circuits are designed. The Pelgrom model and other models are known as local variability models. Due to such variability, differential circuits that detect an electric potential difference of several millivolts are increasingly no longer able to be fabricated by the same convention circuit methods, and it has become difficult to achieve the required impedance adjustment precision.

SUMMARY OF THE INVENTION

An object of the present invention is to provide an impedance adjustment circuit that can inhibit a decrease in impedance adjustment precision caused by variability within the chip, and to provide an integrated circuit device in which the impedance adjustment circuit is mounted.

The impedance adjustment circuit according to the present invention is an impedance adjustment circuit for simulating the buffer circuit of an integrated circuit device, comparing with a reference electric potential an electric potential that corresponds to the simulation result, and adjusting the impedance of the buffer circuit on the basis of the comparison result, whereby the comparison is carried out by three or more differential circuits, and the comparison result is obtained by selecting the majority from among the individual comparison results that are produced by the differential circuits.

In the present invention, the effect of misdetections can be eliminated and accurate comparison results can be output using a method in which a reference electric potential and the electric potential that corresponds to the simulation result are compared by selecting the majority from among the individual comparison results that are produced by three or more differential circuits.

Also, the impedance adjustment circuit may comprise the buffer circuit applying a standard electric potential to an output line on the basis of an input electric potential; the impedance of the buffer circuit being adjusted by adjusting the resistance value between the standard electric potential and the output line in the buffer circuit; a simulation circuit for simulating the resistance value of the buffer circuit by taking as input the same control signal as the control signal for controlling the resistance value of the buffer; a comparator circuit for comparing a reference electric potential and an electric potential that corresponds to the result of the simulation by comparing with the reference electric potential the electric potential that corresponds to the resistance value of the simulation circuit; a control circuit for adjusting the impedance of the buffer circuit by generating the control signal on the basis of the comparison result and outputting the control signal to the simulation circuit and the buffer circuit; and the comparator circuit having three or more differential circuits for comparing with the reference electric potential the electric potential that corresponds to the resistance value of the simulation circuit and outputting the result, and also having a majority circuit for outputting as the comparison result the individual comparison results produced by the majority of the differential circuits of the three or more differential circuits.

Furthermore, the number of the differential circuits is preferably an odd number.

Moreover, the impedance adjustment circuit may comprise three of the differential circuits; the majority circuit having a first to third 2-input AND gates, and a 3-input AND gate; the output of the first differential circuit being input to one of the input terminals of the first 2-input AND gate, and the output of the second differential circuit being input to the other input terminal; the output of the first differential circuit being input to one of the input terminals of the second 2-input AND gate, and the output of the third differential circuit being input to the other input terminal; the output of the third differential circuit being input to one of the input terminals of the third 2-input AND gate, and the output of the second differential circuit being input to the other input terminal; and the outputs of the first to third 2-input AND gates being input to the input terminals, respectively, of the 3-input AND gate.

The integrated circuit device of the present invention comprises a buffer circuit; an impedance adjustment circuit for simulating the buffer circuit, comparing with a reference electric potential an electric potential that corresponds to the simulation result, and adjusting the impedance of the buffer circuit on the basis of the comparison result; the impedance adjustment circuit carrying out the comparison by using three or more differential circuits; and the comparison result being obtained by selecting the majority from among the individual comparison results that are produced by the differential circuits.

In accordance with the present invention, the effect of misdetections of the differential circuits can be eliminated, accurate comparison results can be output, and a reduction in the impedance adjustment precision due to variability within the chip can be inhibited by the comparator circuit taking the majority from among three differential circuits.

BRIEF DESCRIPTION OF THE DRAWINGS

FIG.

FIG. FIG. 1;

FIG. FIG. 1;

FIG. FIG. 3;

FIG. FIG. 3;

FIG. FIG. 3; and

FIG.

DESCRIPTION OF THE PREFERRED EMBODIMENTS

Figure 1:
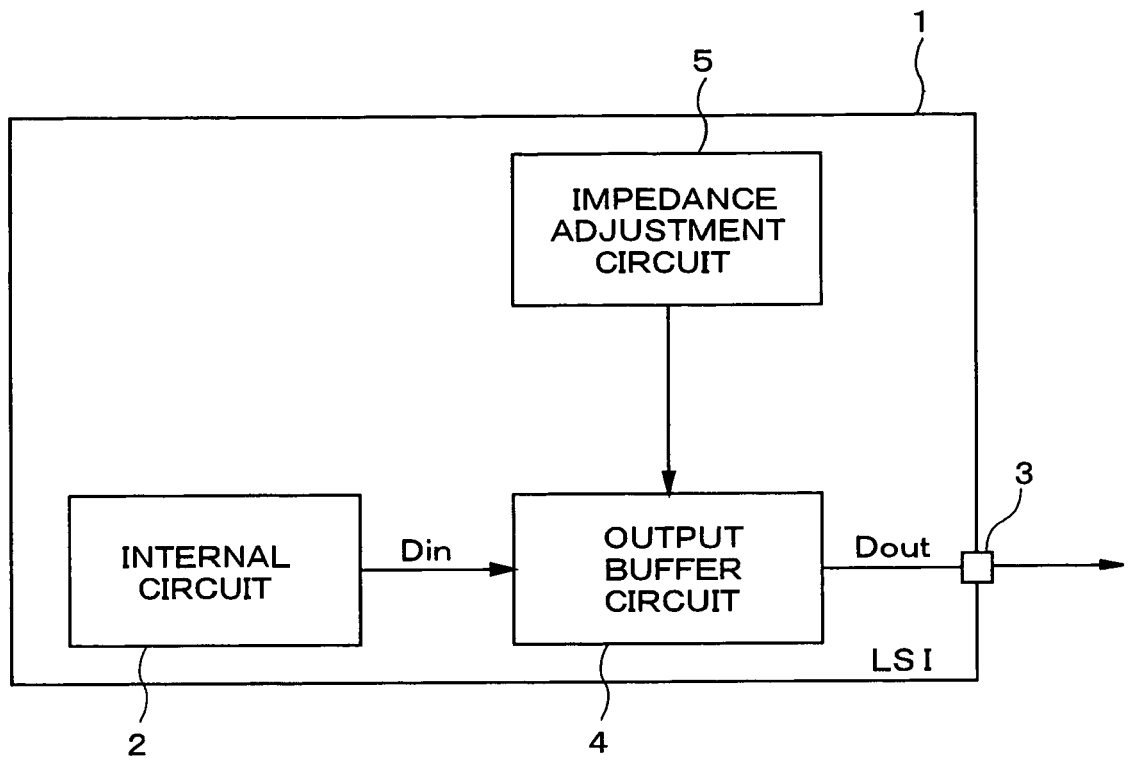
FIG. 1 is a block diagram showing the integrated circuit device of the embodiments of the present invention.
Figure 2:
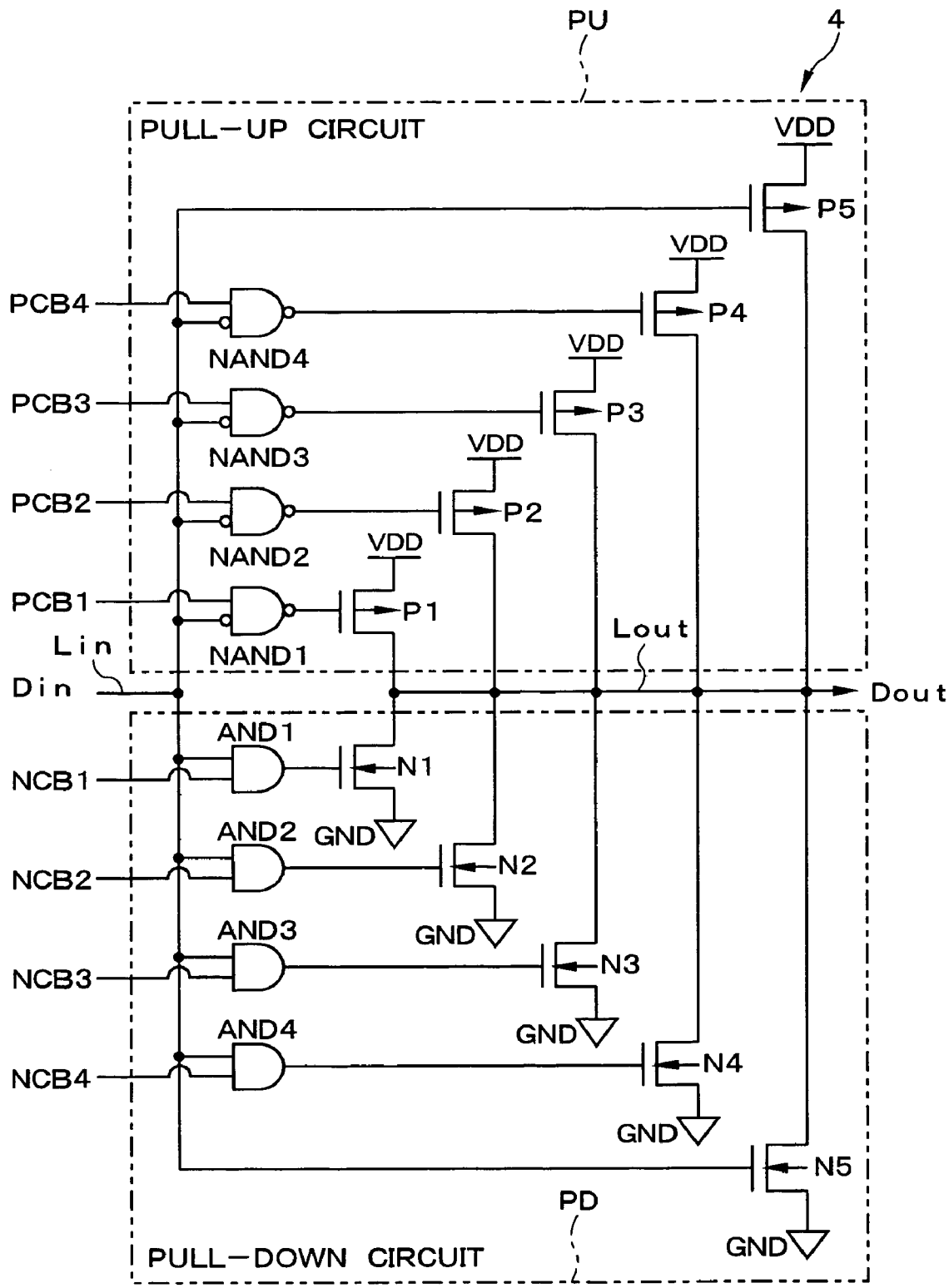
FIG. 2 is a block diagram showing the output buffer circuit shown in FIG.
Figure 3:
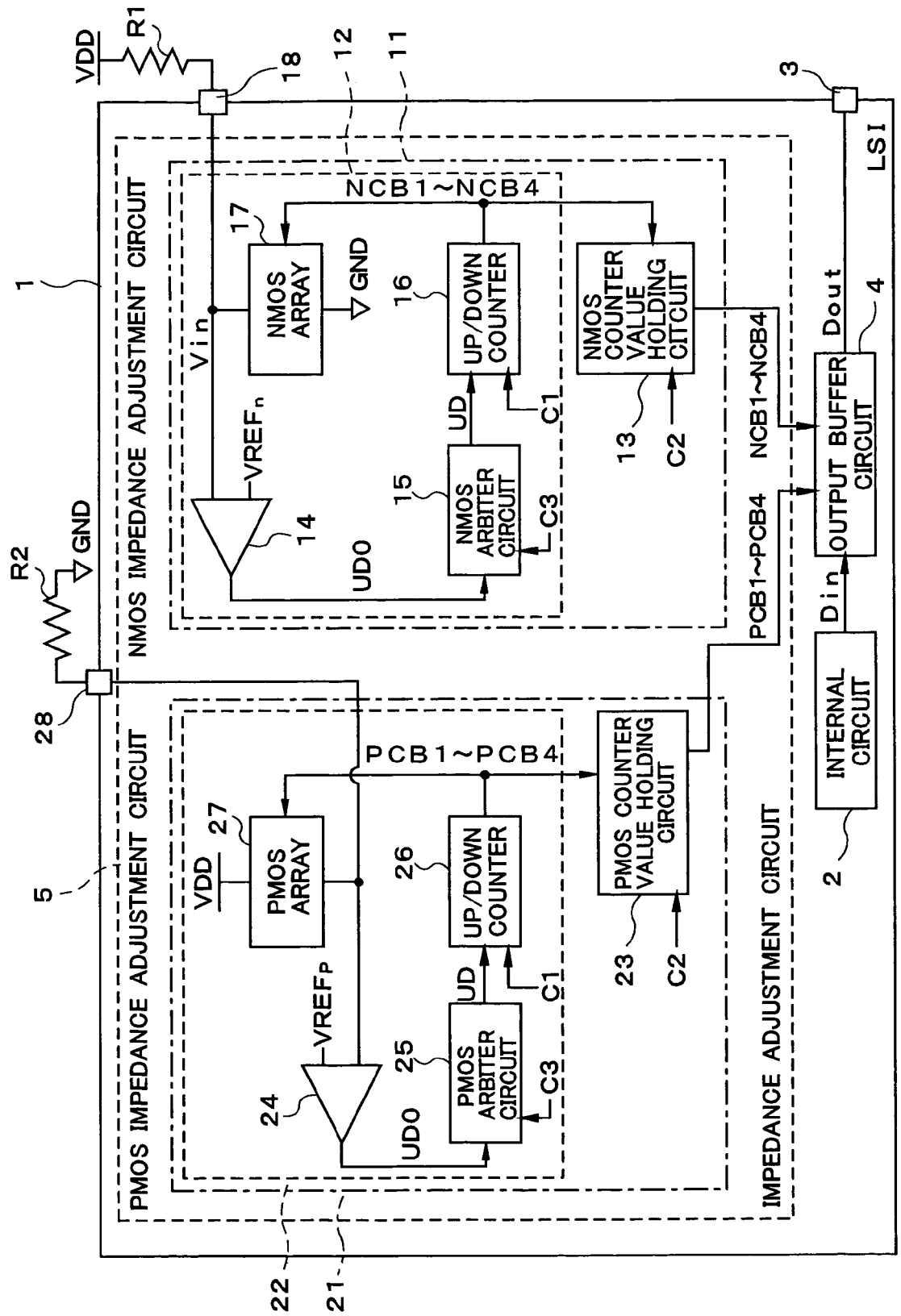
FIG. 3 is a block diagram showing the impedance adjustment circuit shown in FIG.
Figure 4:
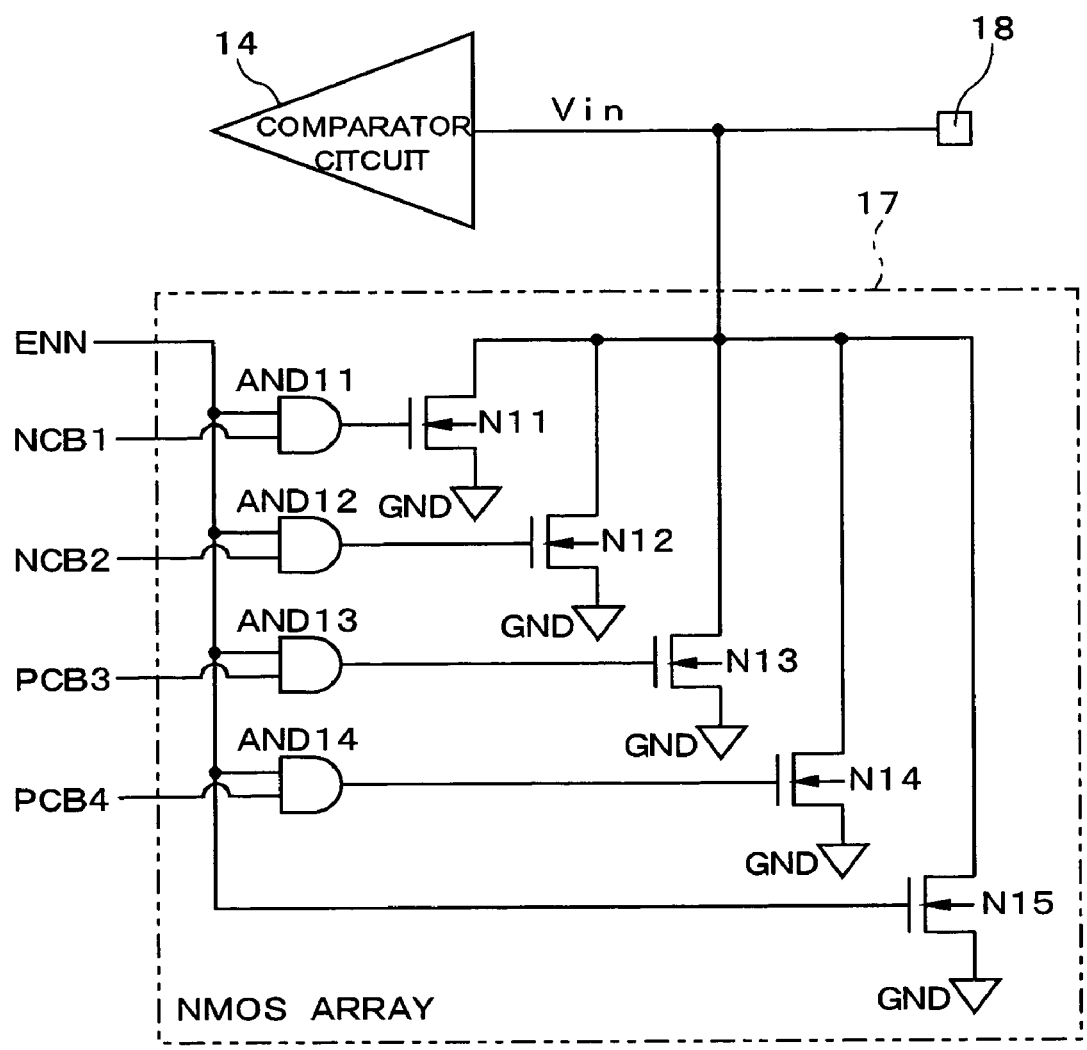
FIG. 4 is a block diagram showing the NMOS array shown in FIG.
Figure 5:
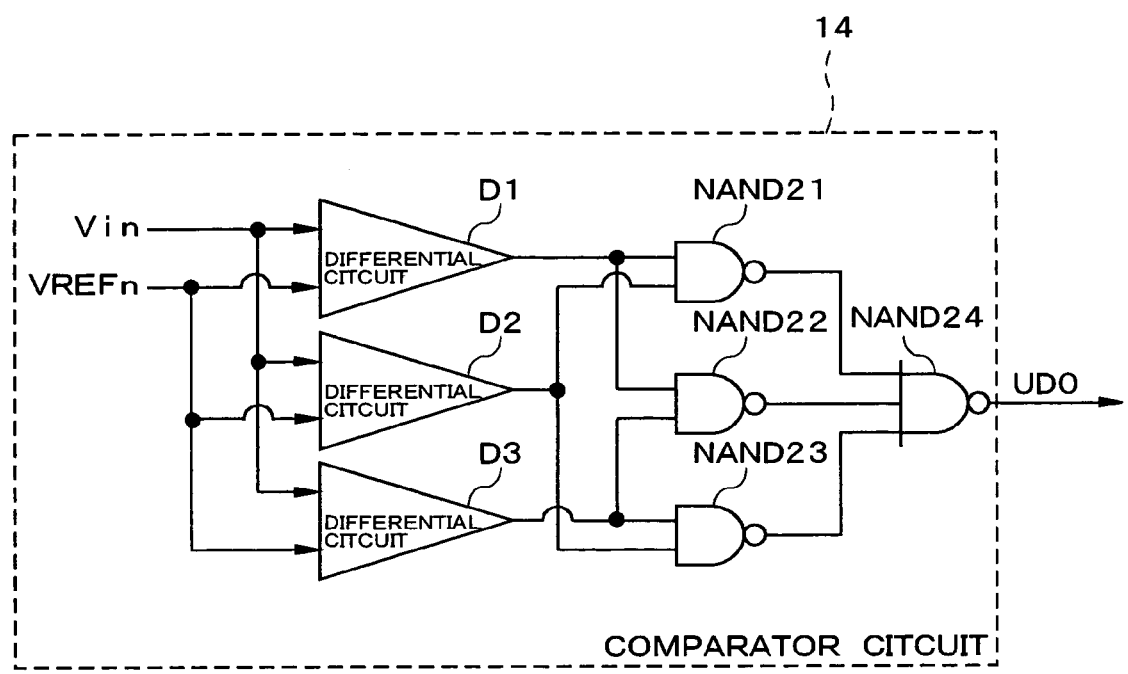
FIG. 5 is a block diagram showing the comparator circuit shown in FIG.
Figure 6:
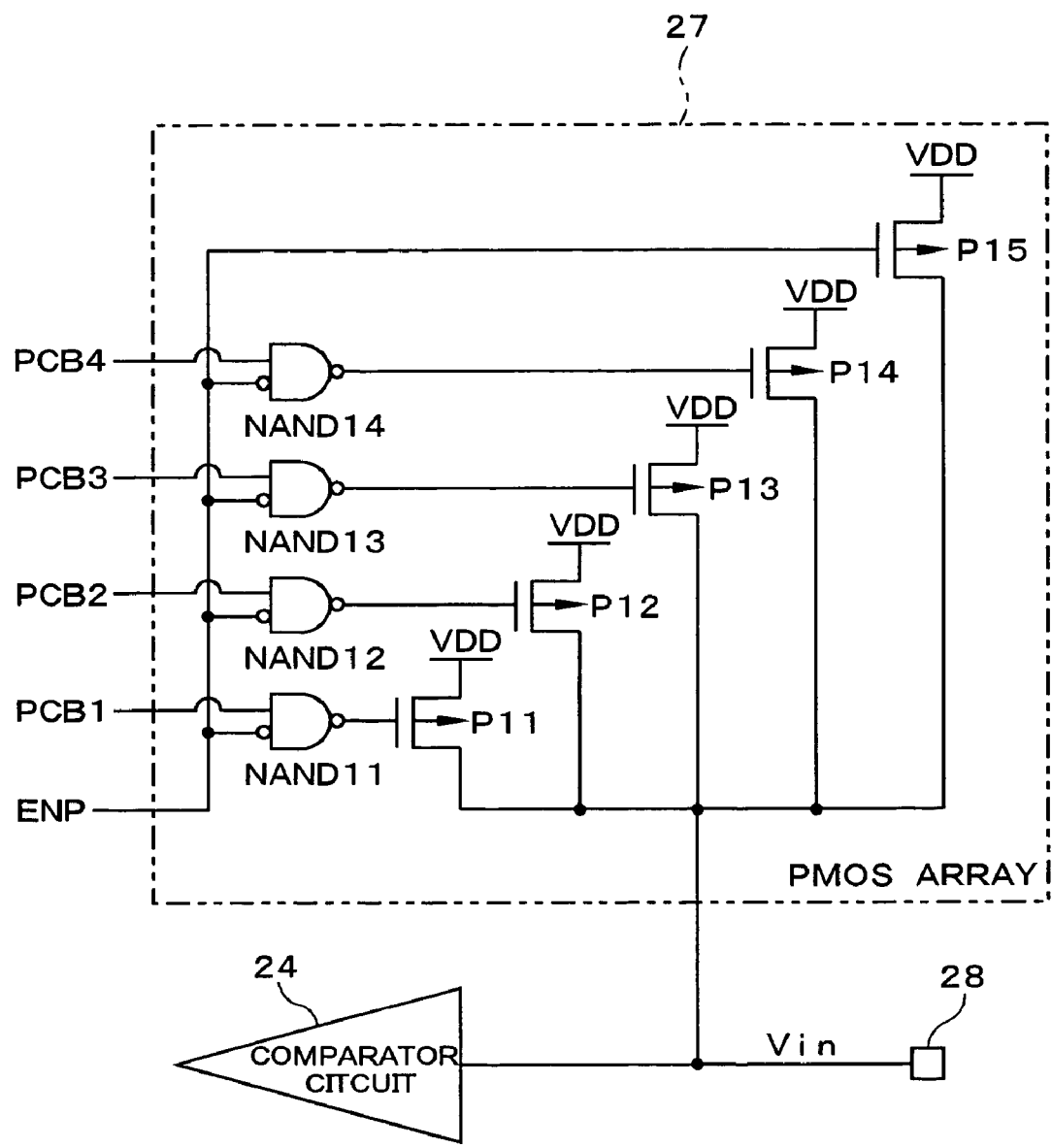
FIG. 6 is a block diagram showing the PMOS array shown in FIG.

The embodiments of the present invention are described in detail below with reference to the attached diagrams. FIG.FIG. 1 is a block diagram showing the integrated circuit device of the embodiments of the present invention; FIG.FIG. 2 is a block diagram showing the output buffer shown in FIG.FIG. 1; FIG.FIG. 3 is a block diagram showing the impedance adjustment circuit shown in FIG.FIG. 1; FIG.FIG. 4 is a block diagram showing the NMOS array shown in FIG.FIG. 3; FIG.FIG. 5 is a block diagram showing the comparator circuit shown in FIG.FIG. 3; and FIG.FIG. 6 is a block diagram showing the PMOS array shown in FIG.FIG. 3.

As shown in FIG.FIG. 1, an internal circuit 2 that performs computing tasks, stores data, and carries out other types of signal processing is provided in LSI 1, which is the integrated circuit device of the present embodiment. Also provided is an output terminal 3 that outputs to the exterior of the LSI 1 signals that are output from the internal circuit 2, and an output buffer circuit 4 is provided between the internal circuit 2 and output terminal 3. The output buffer circuit 4 expands the electric current drive capacity and the dynamic range of the binary input signal Din that is input from the internal circuit 2 to form a binary output signal Dout, and provides output to the exterior of the LSI 1 by way of the output terminal 3. The LSI 1 is provided with an impedance adjustment circuit 5 that adjusts the impedance of the output buffer circuit 4.

An input line Lin by which the input signal Din is input from the internal circuit 2 (see FIG.FIG. 1), and an output line Lout that outputs an output signal Dout to the output terminal 3 are connected to the output buffer circuit 4, as shown in FIG.FIG. 2. Provided to the output buffer circuit 4 are a pull-up circuit PU that increases the electric potential of the output line Lout to the electric potential of the power supply (VDD) when the input signal Din is at a low level, and a pull-down circuit PD for decreasing the electric potential of the output line Lout to ground potential (GND) when the input signal Din is at a high level.

Four NAND gates NAND1 to NAND4, and five PMOS transistors P1 to P5 are disposed in the pull-up circuit PU. The inverted input terminals of the NAND gates NAND1 to NAND4 are connected to the input line Lin, and bit signals PCB1 to PCB4 that constitute a four-bit binary signal are input from the impedance adjustment circuit 5 to the non-inverted input terminals of the NAND gates NAND1 to NAND4, respectively. The PMOS transistors P1 to P5 have a power supply voltage VDD applied to their sources, and the drains are connected to the output line Lout. The gates of the PMOS transistors P1 to P4 are connected to the output terminals of the NAND gates NAND1 to NAND4, respectively, and the gate of the PMOS transistor P5 is connected to the input line Lin.

The ON resistance between the source and drain of the PMOS transistors P1 to P4 is weighted. The ON resistance of the PMOS transistor P2 is $(2 \times Rp1)$, the conductance is $(Cp1/2)$, the ON resistance of the PMOS transistor P3 is $(4 \times Rp1)$, the conductance is $(Cp1/4)$, the ON resistance of the PMOS transistor P4 is $(8 \times Rp1)$, and the conductance is $(Cp1/8)$, where $Rp1$ is the ON resistance of the PMOS transistor P1, and $Cp1$ is the conductance. The ON resistance and conductance of the PMOS transistor P5 are suitably set so that the impedance of the parallel circuit composed of the PMOS transistors P1 and P5 matches the output impedance for the output buffer circuit 4.

Four AND gates AND1 to AND4, and five NMOS transistors N1 to N5 are disposed in the pull-down circuit PD. One of the input terminals of the AND gates AND1 to AND4 is connected to the input line Lin, and bit signals NCB1 and NCB4 that constitute a four-bit binary signal are input from the impedance adjustment circuit 5 to the other input terminals, respectively. The NMOS transistors N1 to N5 have a ground voltage GND applied to their sources, and the drains are connected to the output line Lout. The gates of the NMOS transistors N1 to N4 are connected to the output terminals of the AND gates AND1 to AND4, respectively, and the gate of the NMOS transistor N5 is connected to the input line Lin.

The ON resistance between the source and drain of the NMOS transistors N1 to N4 is weighted. The ON resistance of the NMOS transistor N2 is $(2 \times Rn1)$, the conductance is $(Cn1/2)$, the ON resistance of the NMOS transistor n3 is $(4 \times Rn1)$, the conductance is $(Cn1/4)$, the ON resistance of the NMOS transistor N4 is $(8 \times Rn1)$, and the conductance is $(Cn1/8)$, where When $Rn1$ is the ON resistance of the NMOS transistor N1, and $Cn1$ is the conductance. The ON resistance and conductance of the NMOS transistor N5 are suitably set so that the impedance of the parallel circuit composed of the NMOS transistors N1 and N5 matches the output impedance for the output buffer circuit 4, for example.

An NMOS impedance adjustment circuit 11 and a PMOS impedance adjustment circuit 21 are disposed in the impedance adjustment circuit 5, as shown in FIG.FIG. 3. The NMOS impedance adjustment circuit 11 adjusts the impedance of the pull-down circuit PD (see FIG.FIG. 2) of the output buffer circuit 4, and the PMOS impedance adjustment circuit 21 adjusts the impedance of the pull-up circuit PU (see FIG.FIG. 2) of the output buffer circuit 4.

An NMOS A/D converter 12 and an NMOS count holding circuit 13 are disposed in the NMOS impedance adjustment circuit 11. A comparator circuit 14, an NMOS arbiter circuit 15, a four-bit UP/DOWN counter 16 as a control circuit, and an NMOS array 17 as a simulator circuit are disposed in the NMOS A/D converter 12. A first input terminal of the comparator circuit 14 is connected to the external terminal 18 of the LSI 1, and a reference electric potential VREFn is applied to the second input terminal. The external terminal 18 is connected to one end of a resistor R1 disposed outside of the LSI 1. The power supply potential VDD is applied to the other end of the resistor R1. The resistor R1 is an accurate reference resistance. The comparator 14 compares the electric potential of the external terminal 18 and the reference electric potential VREFn, outputs a high level signal when the electric potential of the external terminal 18 is higher than the reference electric potential VREFn, and outputs a low level signal when the electric potential of the external terminal 18 is lower than the reference electric potential VREFn.

The output signal UD0 of the comparator circuit 14 and a clock signal C3 are input to an NMOS arbiter circuit 15. The NMOS arbiter circuit 15 synchronizes the output signal of the comparator circuit 14 with the clock signal C3 and outputs the result to the UP/DOWN counter 16 as an UP/DOWN signal UD. The output signal (UP/DOWN signal UD) of the NMOS arbiter circuit 15 and a clock signal C1 are input to the UP/DOWN counter 16. The UP/DOWN counter 16 is a synchronous counter that synchronizes with the clock signal C1, reads the output signal of the NMOS arbiter circuit 15, increases the count value by one if the output signal of the NMOS arbiter circuit 15 is a high level signal, decreases the count value by one if the output signal of the NMOS arbiter circuit 15 is a low level signal, and outputs the count value to the NMOS count holding circuit 13 and the NMOS array 17 as a four-bit binary signal composed of the bit signals NCB1 to NCB4. The NMOS count holding circuit 13 accepts and holds the bit signals NCB1 to NCB4 in synchronization with the clock signal C2 and provides output to the output buffer circuit 4.

The NMOS array 17 has the same configuration as the pull-down circuit PD shown in FIG.FIG. 2, and simulates the impedance of the pull-down circuit PD, that is, the resistance value between the output line Lout and the ground potential. More specifically, four AND gates AND11 to AND14, and five NMOS transistors N11 to N15 are disposed in the NMOS array 17, as shown in FIG.FIG. 4. The AND gates AND11 to AND14 of the NMOS array 17 are essentially the same as the AND gates AND1 to AND4, respectively, of the pull-down circuit PD; the NMOS transistors N11 to N15 of the NMOS array 17 are essentially the same as the NMOS transistors N1 to N5, respectively, of the pull-down circuit PD; and these are formed to the same size by the same process.

In the NMOS array 17, however, the drains of the NMOS transistors N11 to N15 are connected to the node between the first input terminal of the comparator circuit 14 and the external terminal 18 rather than to the output line Lout, in contrast to the pull-down circuit PD. An enable signal ENN, rather than the input signal Din, is input to gate of the NMOS transistor N15 and one of the input terminals of the AND gates AND11 to AND14. The enable signal ENN is a signal that is at a high level when the NMOS impedance adjustment circuit 11 adjusts the impedance, and is at a low level at other times. The mutual connections between the AND gates AND11 to AND14 and the NMOS transistors N11 to N15 in the NMOS array 17, and the other external connections of the NMOS array 17, are the same as the mutual connections between the AND gates AND1 to AND4 and the NMOS transistors N1 to N5 in the pull-down circuit PD and the external connections. More specifically, the bit signals NCB1 to NCB4 (four-bit binary signals) from the UP/DOWN counter 16 are input to the other input terminals of the AND gates AND11 to AND14, respectively, and a ground potential is applied to the sources of the NMOS transistors N11 to N15. A series circuit is thereby formed in which the resistor R1 and the NMOS array 17 are connected in the listed order in series between the power supply potential (VDD) and the ground potential (GND), and an electric potential (hereinafter also simply referred to as divided voltage electric potential Vin) in which the electric potential difference between the power supply potential (VDD) and ground potential (GND) is divided by the resistor R1 and NMOS array 17 is input to the first input terminal of the comparator circuit 14.

Three differential circuits D1 to D3 are disposed in the comparator circuit 14, as shown in FIG.FIG. 5. The first input terminals of the differential circuits are each connected to the first input terminal of the comparator circuit 14, and are therefore connected to the external terminal 18. A divided electric potential Vin divided by the above-described resistor R1 and NMOS array 17 is input to the first input terminals of the differential circuits. The second input terminals of the differential circuits are connected to the second input terminal of the comparator circuit 14, and a reference electric potential VREFn is input. The differential circuits D1 to D3 output a high level signal when the electric potential that is input to the first input terminal, that is, the divided electric potential Vin, is higher than the electric potential that is input to the second input terminal, that is, the reference electric potential VREFn. When the electric potential that is input to the first input terminal is lower than the electric potential that is input to the second input terminal, a low level signal is output.

Four NAND gates NAND21 to NAND24 are disposed in the comparator circuit 14. The NAND gates NAND21 to NAND24 are 2-input NAND gates, one of the input terminals of the NAND21 is connected to the output terminal of the differential circuit D1, and the other input terminal is connected to the output terminal of the differential circuit D2. One of the input terminals of the NAND 22 is connected to the output terminal of the differential circuit D1, and the other input terminal is connected to the output terminal of the differential circuit D3. One of the input terminals of the NAND23 is connected to the output terminal of the differential circuit D3, and the other input terminal is connected to the output terminal of the differential circuit D2. The NAND gate NAND24 is a three-input NAND gate; the three inputs are connected to the output terminals of the NAND gates NAND21 to NAND23, respectively; and the output terminal is the output terminal of the comparator circuit 14 and is connected to the input terminal of the NMOS arbiter circuit 15. The NAND gates NAND21 to NAND24 constitute a majority circuit.

The configuration of the PMOS impedance adjustment circuit 21 is the same configuration as the NMOS impedance adjustment circuit 11, but the polarity is inverted. The configuration of the PMOS impedance adjustment circuit 21 is described below.

A PMOS A/D converter 22 and a PMOS count holding circuit 23 are disposed in the PMOS impedance adjustment circuit 21. A comparator circuit 24, a PMOS arbiter circuit 25, a four-bit UP/DOWN counter 26, and a PMOS array 27 are disposed in the PMOS A/D converter 22. A reference electric potential VREFn is applied to a first input terminal of the comparator circuit 24, and a second input terminal is connected to the external terminal 28 of the LSI 1. The external terminal 28 is connected to one end of a resistor R2 disposed outside of the LSI 1. A ground potential (GND) is applied to the other end of the resistor R2. The resistor R2 is an accurate reference resistance. The comparator 24 compares the electric potential of the external terminal 28 and the reference electric potential VREFp, outputs a high level signal when the reference electric potential VREFp is higher than the electric potential of the external terminal 28, and outputs a low level signal when the reference electric potential VREFp is lower than the electric potential of the external terminal 28.

The PMOS arbiter circuit 25 takes as input the output signal UD0 of the comparator circuit 24 and a clock signal C3, synchronizes the output signal of the comparator circuit 24 with the clock signal C3, and outputs the result to the UP/DOWN counter 26 as an UP/DOWN signal UD. The UP/DOWN counter 26 synchronizes with the clock signal C1, reads the output signal (UP/DOWN signal UD) of the PMOS arbiter circuit 25, increases the count value by one if the output signal of the PMOS arbiter circuit 25 is a high level signal, decreases the count value by one if the output signal of PMOS the arbiter circuit 25 is a low level signal, and outputs the count value to the PMOS count holding circuit 23 and the PMOS array 27 as a four-bit binary signal composed of the bit signals PCB1 to PCB4. The PMOS count holding circuit 23 accepts and holds the bit signals PCB1 to PCB4 in synchronization with the clock signal C2 and provides output to the output buffer circuit 4.

The PMOS array 27 has the same configuration as the pull-up circuit PU shown in FIG.FIG. 2, and simulates the impedance of the pull-up circuit PU. More specifically, four NAND gates NAND11 to NAND14, and five PMOS transistors P11 to P15 are disposed in the PMOS array 27, as shown in FIG.FIG. 6. The NAND gates NAND11 to NAND14 of the PMOS array 27 are essentially the same as the NAND gates NAND1 to NAND4, respectively, of the pull-up circuit PU; the PMOS transistors P11 to P15 of the PMOS array 27 are essentially the same as the PMOS transistors P1 to P5, respectively, of the pull-up circuit PU; and the these are formed to the same size by the same process.

In the PMOS array 27, however, the drains of the PMOS transistors P11 to P15 are connected to the node between the second input terminal of the comparator circuit 24 and the external terminal 28 rather than to the output line Lout, in contrast to the pull-up circuit PU, and an enable signal ENP, rather than the input signal Din, is input to the gate of the PMOS transistor P15 and the inverted input terminals of the NAND gates NAND11 to NAND14. The enable signal ENP is a signal that is at a high level when the PMOS impedance adjustment circuit 21 adjusts the impedance, and is at a low level at other times. The mutual connections between the NAND gates NAND11 to NAND14 and the PMOS transistors P11 to P15 in the PMOS array 27, and the other external connections of the PMOS array 27, are the same as the mutual connections between the NAND gates NAND1 to NAND4 and the PMOS transistors P1 to P5 in the pull-up circuit PU and the external connections. More specifically, the bit signals PCB1 to PCB4 (four-bit binary signals) from the UP/DOWN counter 26 are input to the non-inverted input terminals of the NAND gates NAND11 to NAND14, respectively, and a power supply potential is applied to the sources of the PMOS transistors P11 to P15. A series circuit is thereby formed in which the resistor R2 and the PMOS array 27 are connected in the listed order in series between the power supply potential (VDD) and the ground potential (GND), and an electric potential in which the electric potential difference between the power supply potential (VDD) and ground potential (GND) is divided by the resistor R2 and PMOS array 27 is input to the first input terminal of the comparator circuit 24.

The configuration of the comparator circuit 24 is the same as the configuration of the comparator circuit 14 shown in FIG.FIG. 5. More specifically, three differential circuits are disposed in the comparator circuit 24, a reference electric potential VREFp is input to the first input terminals of the differential circuits, and a divided electric potential Vin divided by the resistor R2 and PMOS array 27 described above is input to the second input terminals of the differential circuits by way of the external terminal 28. The differential circuits output a high level signal when the electric potential that is input to the first input terminal, that is, the reference electric potential VREFp, is higher than the electric potential that is input to the second input terminal, that is, the divided electric potential Vin described above. When the electric potential that is input to the first input terminal is lower than the electric potential that is input to the second input terminal, a low level signal is output. The configuration other than that described above in the comparator circuit 24 is the same as the comparator circuit 14. In other words, four NAND gates are disposed in the comparator circuit 24 and are connected to three differential circuits by the same configuration as the comparator circuit 14.

Figure 7:
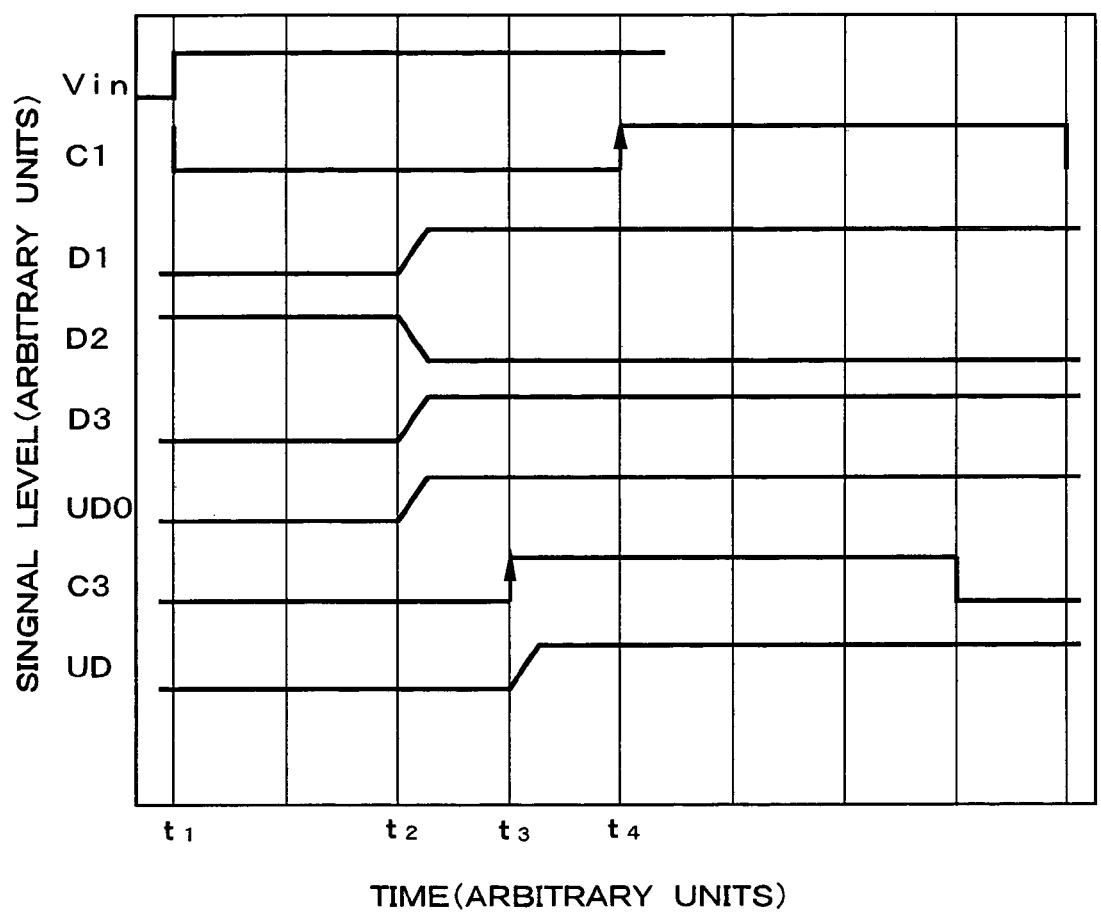
FIG. 7 is a graph showing the operation of the NMOS impedance adjustment circuit in the present embodiment, wherein the horizontal axis represents time and the vertical axis represents the signal level.

Described next is the operation of the integrated circuit device (LSI 1) of the present embodiment configured as described above. FIG.FIG. 7 is a graph showing the operation of the NMOS impedance adjustment circuit in the present embodiment, wherein the horizontal axis represents time and the vertical axis represents the signal level. In LSI 1, the data signal output from the internal circuit 2 is input to the output buffer circuit 4 as an input signal Din, as shown in FIGS. 3 and 4. In the output buffer circuit 4, the electric potential of the output line Lout is increased to the power supply potential (VDD) by the pull-up circuit PU when the input signal Din is at low level, and the electric potential of the output line Lout is decreased to the ground electric potential (GND) by the pull-down circuit PD when the input signal Din is at a high level. Thus, the output buffer circuit 4 expands the electric current drive capacity and the dynamic range of the input signal Din, and outputs an output signal Dout to the exterior of the LSI 1 by way of the output terminal 3. In this case, the impedance of the pull-down circuit PD is adjusted by the NMOS impedance adjustment circuit 11, and the impedance of the pull-up circuit PU is adjusted by the PMOS impedance adjustment circuit 21.

Described first is the operation in which the NMOS impedance adjustment circuit 11 adjusts the impedance of the pull-down circuit PD. When a power supply potential (VDD) and ground potential (GND) are applied to the LSI 1 shown in FIG.FIG. 3 at time t1 shown in FIG.FIG. 7, the electric potential of the external terminal 18 is made equal to the divided electric potential Vin, which is determined by the resistor R1 and NMOS array 17. The divided electric potential Vin is thereby applied to the first input terminal of the comparator circuit 14.

Next, reference electric potential VREFn is applied to the second input terminal of the comparator circuit 14 at time t2 shown in FIG.FIG. 7. The reference electric potential VREFn is set to (VDD/2), for example, and the enable signal ENN (see FIG.FIG. 4) is set to a high level. A divided electric potential Vin is thereby input to the first input terminals of the differential circuits D1 to D3, and the reference electric potential VREFn is input to the second input terminals in the comparator circuit 14, as shown in FIG.FIG. 5. Each of the differential circuits D1 to D3 outputs a high level signal when the divided electric potential Vin input to the first input terminals is higher than the reference electric potential VREFn input to the second input terminals, and outputs a low level signal when the divided electric potential Vin is lower than the reference electric potential VREFn.

At this time, the output levels of the three differential circuits D1 to D3 are ordinarily the same. In other words, all three are at a high level or all three are at a low level. When the output levels of the differential circuits D1 to D3 are all at a high level, high level signals are input to all the input terminals of the NAND gates NAND21 to NAND23. The output levels of the NAND gates NAND21 to NAND23 are thereby all set at a low level, and the output level of the NAND gate NAND24 is therefore set to a high level. As a result, a high level signal is output as the majority logic UO0 from the comparator circuit 14.

When the output levels of the differential circuits D1 to D3 are all at a low level, the signals input to the input terminals of the NAND gates NAND21 to NAND23 are all at a low level. The output levels of the NAND gates NAND21 to NAND23 are all thereby set at a high level, and the output level of the NAND gate NAND24 is set at a low level. As a result, a low level signal is output as the majority logic UO0 from the comparator circuit 14.

However, when the size of the differential circuits is reduced, the effect of variability in the process increases. For this reason, when the divided electric potential Vin input to the first input terminal of the comparator circuit 14 is approximate to the reference electric potential VREFn, there is a possibility that the differential circuits will make a misdetection in the case that the electric potential is several millivolts or less, for example. Described below is the case in which one of the three differential circuits makes a misdetection. In this example, it is the differential circuit D2. Following is a description of an example in which the divided electric potential Vin is slightly higher than the reference electric potential VREFn, and the differential circuits D1 and D3 have correctly detected the difference and have output a high level signal, but the differential circuit D2 has misdetected the difference and output a low level signal.

In this case, a high level signal is input to one of the input terminals of the NAND gate NAND21, and a low level signal is input to the other input terminal. A high level signal is thereby output from the NAND gate NAND21. Also, a high level signal is input to one of the input terminals of the NAND gate NAND22, and a high level signal is input to the other input terminal. A low level signal is thereby output from the NAND gate NAND22. Furthermore, a high level signal is input to one of the input terminals of the NAND gate NAND23, and a low level signal is input to the other input terminal. A high level signal is thereby output from the NAND gate NAND23. As a result, a high level, a low level, and a high level signal are input to the three input terminals, respectively, of the NAND gate NAND24, and the output signal of the NAND gate NAND24 is set to a high level.

Described next is an example in which the divided electric potential Vin is slightly lower than the reference electric potential VREFn, and the differential circuits D1 and D3 have correctly detected the difference and have output a low level signal, but the differential circuit D2 has misdetected the difference and output a high level signal. In this case, a low level signal is input to one of the input terminals of the NAND gate NAND21, and a high level signal is input to the other input terminal. A high level signal is thereby output from the NAND gate NAND21. Also, a low level signal is input to one of the input terminals of the NAND gate NAND22, and a low level signal is input to the other input terminal. A high level signal is thereby output from the NAND gate NAND22. Furthermore, a low level signal is input to one of the input terminals of the NAND gate NAND23, and a high level signal is input to the other input terminal. A high level signal is thereby output from the NAND gate NAND23. As a result, a high level, a high level, and a high level signal are input to the three input terminals, respectively, of the NAND gate NAND24, and the output signal of the NAND gate NAND24 is set to a low level. Thus, the comparator circuit 14 can eliminate the effect of the misdetection and can output the correct detection result by taking the majority logic of the three differential circuits, even in the case that the differential circuit D2 has made a misdetection.

The case in which the differential circuit D2 has made a misdetection is described above, but the effect of a misdetection can be eliminated by the same operation as that described above even when the differential circuit D1 or differential circuit D3 makes a misdetection and the other two differential circuits make the correct detection.

The output signal of the comparator circuit 14, that is, the majority logic UD0, is output to the NMOS arbiter circuit 15. The NMOS arbiter circuit 15 thereafter reads the majority logic UD0 in synchronization with the timing of the rise of the clock signal C3 at time t3 shown in FIG.FIG. 7, and outputs the result to the UP/DOWN counter 16 as an UP/DOWN signal UD.

Next, the UP/DOWN counter 16 reads the UP/DOWN signal UD in synchronization with the rise of the clock signal C1 at time t4 shown in FIG.FIG. 7. The UP/DOWN counter 16 holds a four-bit counter value, that is, a binary value, between 0000 and 1111. When the UP/DOWN signal UD is at a high level, the counter value is increased by one, and when the UP/DOWN signal UD is at a low level the counter value is decreased by one. When the counter value has reached the lowest value (0000), further countdown is not carried out, and when the counter value has reached the highest value (1111), further count-up is not carried out. The UP/DOWN counter 16 outputs the counter value to the NMOS count holding circuit 13 and NMOS array 17 as bit signals NCB1 to NCB4. The bit signals NCB1 to NCB4 express the numerical values of the bits of the counter value.

At this point, the enable signal ENN is at a high level in the NMOS array 17, as shown in FIG.FIG. 4. Therefore, the output level of the AND gate AND11 is set to a high level, and the NMOS transistor N11 is made conductive if the bit signal NCB1 is at a high level. Similarly, if the bit signals NCB2 to NCB4 are at a high level, the output levels of the AND gates AND12 to AND14 are each set to a high level and the NMOS transistor N12 to N14 are each made conductive. Thus, an NMOS transistor that conducts in accordance with the counter value is selected in the NMOS array 17, and the resistance value of the NMOS array 17 decreases as the counter value increases. In other words, when the counter value increases by one, the resistance value of the NMOS array 17 decreases, and when the counter value decreases by one, the resistance value of the NMOS array 17 increases.

Accordingly, when the resistance value of the NMOS array 17 is made greater than the resistor R1, the divided electric potential Vin is higher than the reference electric potential VREFn (=VDD/2), the majority logic UD0 and the UP/DOWN signal UD are set to a high level, and the counter value of the UP/DOWN counter 16 increases by one. As a result, the resistance value of the NMOS array 17 decreases. Also, when the resistance value of the NMOS array 17 is lower than the resistor R1, the divided electric potential Vin is lower than the reference electric potential VREFn (=VDD/2), the majority logic UD0 and the UP/DOWN signal UD are set to a low level, and the counter value of the UP/DOWN counter 16 decreases by one. As a result, the resistance value of the NMOS array 17 increases. This operation is repeated until the resistance value of the NMOS array 17 matches a desired resistance value within an error tolerance range designed for the resistance value of the resistor R1.

The output signal of the UP/DOWN counter 16 is presented to the NMOS count holding circuit 13 in synchronization with the rise of the clock signal C2, and is fed to the pull-down circuit PD (see FIG.FIG. 2) of the output buffer circuit 4. The resistance value of the pull-down circuit PD thereby changes together with the resistance value of the NMOS array 17, and is adjusted so as to be equal to the desired resistance value. This may, for example, be the resistance value of the resistor R1, which is the externally mounted reference resistance.

Thus, the NMOS impedance adjustment circuit 11 uses an external resistor R1 to adjust the output drive capacity of the pull-down circuit PD by analog/digital conversion of the divided electric potential, and to digitally encode the divided electric potential, and matches the output impedance of the output buffer circuit with the impedance of an external element driven by the output buffer circuit.

The operation by which the PMOS impedance adjustment circuit 21 adjusts the impedance of the pull-up circuit PU is similar to the operation described above by which the NMOS impedance adjustment circuit 11 adjusts the impedance of the pull-down circuit PD. In other words, the application of the power supply potential (VDD) and ground potential (GND) to the LSI 1 causes the divided electric potential Vin (which is divided by the PMOS array 27 and the externally mounted reference resistor R2) to be input to the second input terminal of the comparator circuit 24, as shown in FIG.FIG. 3. The differential circuits of the comparator circuit 24 compares the divided electric potential Vin and the reference electric potential VREFn, the comparator circuit 24 adopts the comparison results of the differential circuits by means of majority logic, and the result is output to the PMOS arbiter circuit 25. Even in the case that one of the three differential circuits makes a misdetection due to variability or another factor in the process, the correct detection result for the comparator circuit 24 overall can be output if the other two differential circuits make correct detections.

The PMOS arbiter circuit 25 receives the majority logic UD0 in synchronization with the clock signal C3, and outputs the result to the UP/DOWN counter 26 as an UP/DOWN signal UD. In this case, if the reference electric potential VREFp is higher than the divided electric potential Vin, a high level signal is input to the UP/DOWN counter 26, and the counter value is increased by one. Conversely, if the reference electric potential VREFp is lower than the divided electric potential Vin, a low level signal is input to the UP/DOWN counter 26, and the counter value is decreased by one. If the counter value increases, the resistance value of the PMOS array 27 decreases and the divided electric potential Vin increases. Conversely, if the counter value decreases, the resistance value of the PMOS array 27 increases and the divided electric potential Vin decreases. The resistance value of the PMOS array 27 is thereby adjusted so that the divided electric potential Vin becomes equal to the reference electric potential VREFp. This is accompanied by a process in which the resistance value of the pull-up circuit PU of the output buffer circuit 4 is adjusted and the output impedance is adjusted. In this fashion, impedance matching can be carried out by adjusting the electric current drive capacity of the pull-up circuit PU and pull-down circuit PD of the output buffer circuit 4.

The effects of the present embodiment are described next. As the size of integrated circuit devices becomes increasingly smaller, the effect of variability in the process becomes more pronounced and the variability of differential circuits constituting the comparator circuit increases. For this reason, if the difference in the electric potentials is slight when the comparator circuit compares the divided electric potential and reference electric potential, the differential circuit may make a misdetection. Since the comparator is composed of a single differential circuit in a conventional impedance adjustment circuit, when the differential circuit makes a misdetection, the result of the misdetection is directly output from the comparator circuit, the UP/DOWN counter malfunctions, and the impedance of the output buffer circuit cannot be correctly adjusted.

In contrast, in the present embodiment, three differential circuits each are provided to the comparator circuits 14 and 24 of the impedance adjustment circuit 5, and the majority from among the detection results produced by the differential circuits is adopted. Therefore, the effect of a misdetection can be eliminated and a correct detection result for the comparator circuit overall can be output even if a single differential circuit malfunctions. As a result, it is possible to prevent a reduction in the detection precision of the comparator circuit and a malfunction of the impedance adjustment circuit if the effect of variability in the process increases due to smaller integrated circuit devices, and one of the differential circuits constituting the comparator circuit makes a misdetection.

In the present embodiment, an example was shown in which three differential circuits were provided to the comparator circuit, but the present invention is not limited to this number, and the number of differential circuits provided to the comparator circuit may be three or more. However, in order to avoid a handling problem when the detection result is divided into equal numbers, the number of differential circuits is preferably an odd number. Five, seven, or nine differential circuits may be used, for example. The differential circuits provided to the comparator circuit are not required to be exactly the same circuit as each other, and there is no drawback if the circuit configurations are mutually different as long as the circuits can make a comparison with the reference electric potential.

Furthermore, in the present embodiment, an example was shown in which the impedance of the output buffer circuit was adjusted using an impedance adjustment circuit, but the present invention is not limited thereby, and application may also be made to adjust the impedance of an input buffer circuit, for example.

What is claimed is:

1. An impedance adjustment circuit comprising:
   a simulation circuit simulating a buffer circuit of an integrated circuit device, said simulation circuit having an input that receives a control signal that controls a resistance of the buffer circuit and an output that outputs a simulation result;
   a comparison circuit having three differential circuits that each compare a same reference electric potential to a same electric potential that corresponds to the simulation result and a majority circuit that provides a comparison result by selecting the majority from among individual comparison results produced by said three differential circuits; and
   a control circuit with an output that outputs the control signal to said simulation circuit and to the buffer circuit based on the comparison result,
   wherein said majority circuit has first to third 2-input AND gates, and a 3-input AND gate;
   the output of first said differential circuit being input to one of the input terminals of said first 2-input AND gate, and the output of second said differential circuit being input to the other input terminal;
   the output of said first differential circuit being input to one of the input terminals of said second 2-input AND gate, and the output of third said differential circuit being input to the other input terminal;

the output of said third differential circuit being input to one of the input terminals of said third 2-input AND gate, and the output of said second differential circuit being input to the other input terminal; and the outputs of said first to third 2-input AND gates being input to the input terminals, respectively, of said 3-input AND gate.

2. An integrated circuit device comprising:

a buffer circuit applying a standard electric potential to an output line on the basis of an input electric potential; and an impedance adjustment circuit for simulating the buffer circuit, comparing a reference electric potential to an electric potential that corresponds to a simulation result, and adjusting the impedance of said buffer circuit on the basis of the comparison result, said impedance adjustment circuit carrying out said comparison by using an odd number of three or more differential circuits, said impedance adjustment circuit adjusting the impedance of said buffer circuit by adjusting a resistance value between said standard electric potential and an output line in said buffer circuit, said impedance adjustment circuit having a simulation circuit for simulating said resistance value of said buffer circuit by taking as input the same control signal as the control signal for controlling the resistance value of said buffer, a comparator circuit for comparing the reference electric potential and an electric potential that corresponds to the result of said simulation by comparing said reference electric potential to the electric potential that corresponds to the resistance value of the simulation circuit, and a control circuit for adjusting the impedance of said buffer circuit by generating said control signal on the basis of the comparison result and outputting the control signal to said simulation circuit and said buffer circuit; and said comparator circuit having said three or more differential circuits for comparing said reference electric potential to the electric potential that corresponds to the resistance value of said simulation circuit and outputting the result, and a majority circuit for outputting as said comparison result the individual comparison results produced by the majority of the differential circuits of said three or more differential circuits, said comparison result being obtained by selecting the majority from among the individual comparison results that are produced by the differential circuits, said majority circuit having a first to third 2-input AND gates, and a 3-input AND gate;

the output of first said differential circuit being input to one of the input terminals of said first 2-input AND gate, and the output of second said differential circuit being input to the other input terminal;

the output of said first differential circuit being input to one of the input terminals of said second 2-input AND gate, and the output of third said differential circuit being input to the other input terminal;

the output of said third differential circuit being input to one of the input terminals of said third 2-input AND gate, and the output of said second differential circuit being input to the other input terminal; and the outputs of said first to third 2-input AND gates being input to the input terminals, respectively, of said 3-input AND gate.

* * * * *